United States Patent
Sinclair et al.

(10) Patent No.: US 6,351,051 B1
(45) Date of Patent: Feb. 26, 2002

(54) MICROELECTROMECHANICAL SYSTEMS ACTUTTOR USING A TIME-VARYING MAGNETIC FIELD

(75) Inventors: Michael J. Sinclair, Kirkland, WA (US); Jeremy A. Levitan, Cambridge, MA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/545,556

(22) Filed: Apr. 7, 2000

(51) Int. Cl.[7] ............................................. H02K 21/12
(52) U.S. Cl. ............................ 310/166; 310/40 MM; 335/220; 29/596
(58) Field of Search ................................ 310/166, 171, 310/40 MM, 308, 309, 12; 335/231, 234, 236, 241, 220; 29/596, 598

(56) References Cited

U.S. PATENT DOCUMENTS

| | | | | |
|---|---|---|---|---|
| 4,733,115 A | * | 3/1988 | Barone et al. | 310/68 R |
| 5,113,100 A | * | 5/1992 | Taghezout | 310/40 MM |
| 5,191,251 A | * | 3/1993 | Paratte | 310/309 |
| 5,206,983 A | * | 5/1993 | Guckel et al. | 29/598 |
| 5,644,177 A | * | 7/1997 | Guckel et al. | 310/40 MM |
| 5,808,384 A | * | 9/1998 | Tabat et al. | 310/40 MM |
| 5,889,452 A | * | 3/1999 | Vuilleumier | 335/80 |

* cited by examiner

Primary Examiner—Burton S. Mullins
Assistant Examiner—Thanh Lam
(74) Attorney, Agent, or Firm—Ipsolon LLP

(57) ABSTRACT

Moving a panel on a microelectromechanical system by generating a magnetic force that acts on the panel is disclosed. The panel is formed on, or coupled to, a substrate so as to be able to move between first and second positions. The panel includes an electrically conductive region, such as a metallic ring or sheet, or a doped polysilicon layer. An electrical coil is also located on the substrate and coupled to a power source that can generate time-varying current. When a time-varying current is conducted through the coil, a magnetic flux is generated in the coil that induces an electromotive force (emf) in the panel that, in turn, generates a magnetic flux having a direction that is opposite the magnetic flux in the coil. The opposing magnetic fluxes create a repulsive magnetic force that urges the panel to move away from the coil. A flat spring is provided to hold the panel in a desired position and provide a drag force on the panel as it moves.

30 Claims, 2 Drawing Sheets

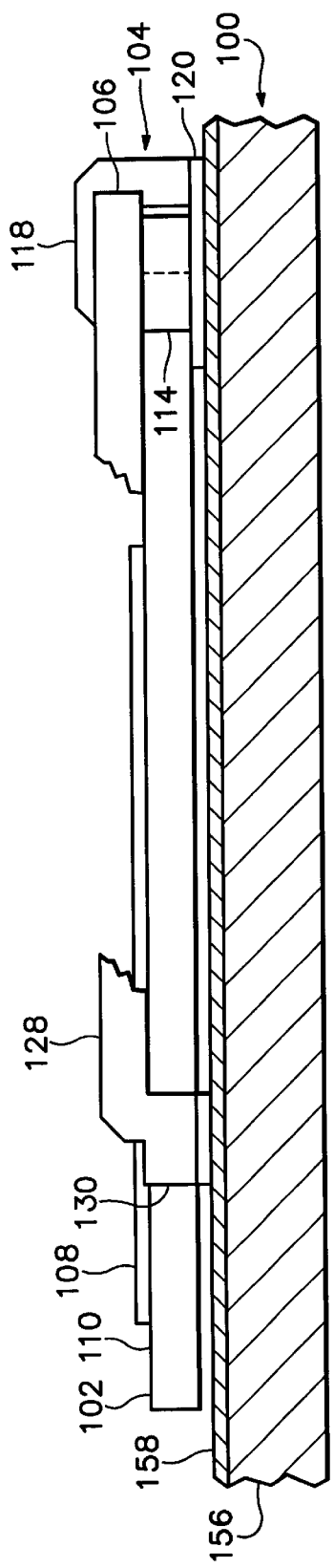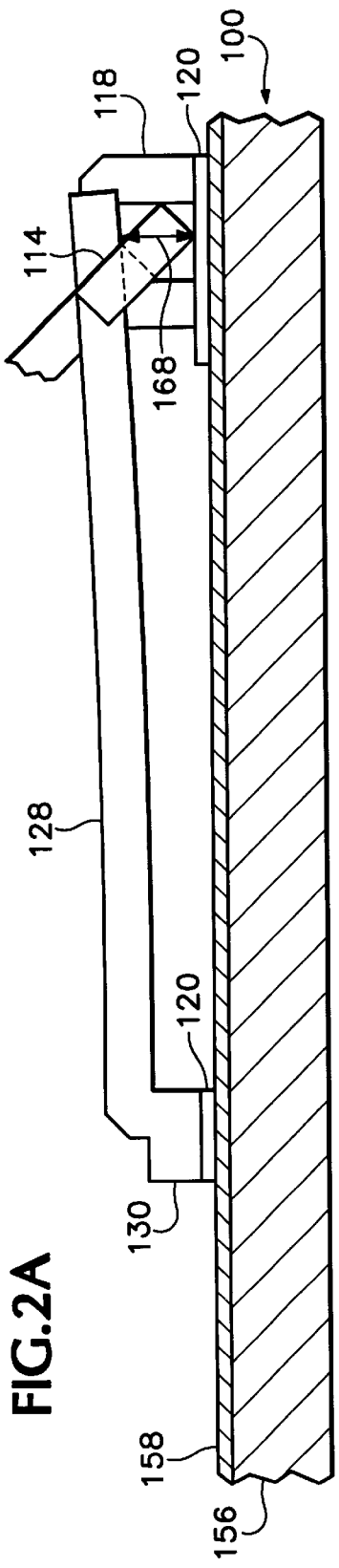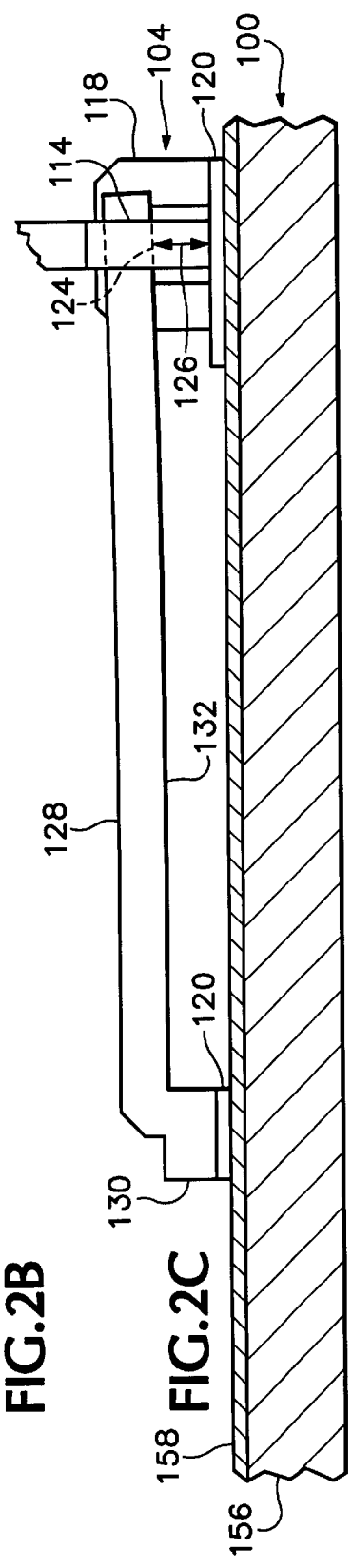

MICROELECTROMECHANICAL SYSTEMS ACTUTTOR USING A TIME-VARYING MAGNETIC FIELD

BACKGROUND OF THE INVENTION

1. Field of the Invention

This invention pertains to microelectromechanical systems (MEMS) actuators.

2. Description of the Related Art

Electrically controlled actuators receive an electrical signal input and provide a mechanical output. The mechanical output provides power (force times displacement, per unit time) that can be used to move objects. Large, electrically controlled actuators are common in mechanical systems to control valves, pumps, switches and otherwise move objects.

Recent innovations require control of very small components that are formed on semiconductor substrates by conventional semiconductor fabrication processes. Groups of such components are known as microelectromechanical systems (MEMS). MEMS borrow design elements from their larger, conventional-size, functional equivalents, but must be adapted to semiconductor fabrication techniques and the dynamics of miniature size. An often essential part of MEMS are actuators that provide physical movement or force to other MEMS components in order to operate, or initiate, the MEMS device.

In U.S. Pat. No. 5,808,384 a photolithographic process is used to fabricate a MEMS having an actuator that controls switches, relays, and valves. This actuator consists of a coil and magnetic core to move a member. However, this actuator is capable of only a very small range of motion and is thus limited to particular applications in which a relatively small range of motion is required.

Certain MEMS devices include relatively large planar objects that require a means to position the planar object for operation. In so-called "billboard" applications, a planar object is formed flat against a supporting substrate and must be moved upright for use (i.e., oblique, or orthogonal, to the substrate)—similar to how a roadside advertising billboard is arranged relative to its supporting ground surface.

U.S. Pat. No. 5,867,297 discloses such a billboard application in relation to a prior art MEMS optical scanner in which a mirror is fabricated in the horizontal plane (i.e., parallel to the substrate upon which the mirror is formed) and then lifted into a substantially vertical arrangement. The U.S. Pat. No. 5,867,297 states that a comb drive may be used to facilitate the process of raising the billboard.

A known electrical device is a conductive coil. When current passes through the coil, a magnetic flux is generated in the coil. Further, when the magnetic flux is changing, an electromotive force (emf) may be induced in a conductive object located in the path of the coil's magnetic flux. The induced emf further creates a magnetic flux. Lenz's law states that the induced emf in a conductor is always polarized in a direction so as to oppose the change that causes the induced emf. Thus, the magnetic flux in the conductive object will oppose the magnetic flux in the coil creating a repulsive magnetic force that acts to push apart the coil and object.

A prior art method of fabrication of MEMS is a multi-user MEMS process (referred to as MUMPs). In general, the MUMPs process provides up to three-layers of conformal polysilicon that are etched to create a desired physical structure. The first layer, POLY 0, is coupled to a supporting nonconductive wafer. The second and third layers, POLY 1 and POLY 2, are mechanical layers that can be separated from their underlying structure by the use of sacrificial layers that separate the layers during fabrication and are removed near the end of the process. The POLY 1 and POLY 2layers may also be fixed to the underlying structure (the wafer or lower POLY 0 or POLY 1 layer as the case may be) through openings, or vias, made by etching.

The MUMPs process also provides for a final top layer of 0.5 $\mu$m thick metal for probing, bonding, electrical routing and reflective mirror surfaces.

Further information of the MUMPs process is available from Cronos Microsystems, Inc., 3021 Cornwallis Road, Research Triangle Park, N.C.

In preferred embodiments, the device of the present invention is fabricated by the MUMPs process. However, the MUMPs process may change as dictated by Cronos Microsystems, Inc., or other design considerations. The MUMPs fabrication process is not a part of the present invention and is only one of several processes that can be used to make the present invention.

SUMMARY OF THE INVNEITON

The present invention overcomes the problems of the prior art by providing a microelectromechanical systems actuator that uses very little space on a substrate, is inexpensive to fabricate, and is very reliable. In addition, the present invention provides a billboard that does not require electrical connection to the substrate or a power source, the invention does not require magnetic materials, and the fabrication is compatible with existing integrated circuit fabrication methods.

In preferred embodiments of the actuator of the present invention, the actuator includes a substrate, a magnetic flux generator that provides a magnetic flux along a flux direction, and a substantially planar device, such as a panel, that is hingedly coupled to the substrate so that the panel can pivot between a first position and a second position. Further, the panel has an electrically conductive portion, or region, such as a metallic ring formed on its surface.

Activation of the magnetic flux generator creates a time-varying magnetic flux along the flux direction that induces an electromotive force (emf) in the conductive portion of the panel. The emf in the panel creates a second magnetic flux that creates a repulsive magnetic force between the magnetic flux generator and the panel that moves the panel from the first position to the second position.

In preferred embodiments, the magnetic flux generator is a conductive coil fabricated on the substrate so as to encircle one or more panels. The coil may also be located between the substrate and the panel. Coupled to the coil is a power source that provides a time-varying electrical current, such as a current pulse. As the current pulse is conducted in the coil, a time-varying magnetic flux is created in the coil that induces the emf in the conductive region of the panel.

Preferred embodiments of the present invention also include a flat spring that holds the panel in the second position. The preferred flat spring is a cantilevered arm that is biased against an extension of the panel. As the panel moves, the flat spring presses against the panel extension, creating a drag force. When the panel reaches a desired second position, the flat spring moves into a cutout, or receptacle, of the extension and holds the panel in the desired position. The flat spring may also be configured so that the drag force acts to hold the panel whenever the magnetic force is not sufficient to overcome the drag force, thus holding the panel in any desired position between the first and second positions.

In preferred embodiments, the panel is hinged to the substrate so as to pivot relative to the substrate. Thus, the panel can move from a first position that is parallel to the substrate, to a second position that is oblique or orthogonal to the substrate. Alternatively, the panel is coupled to the substrate by biased fingers, or a scaffold, that guides the movement of the panel when the magnetic force moves the panel. Such alternative couplers may be configured so that the panel remains substantially parallel to the substrate and moves upward with little or no pivoting.

The present invention also provides a method of moving the panel between first and second positions. In the preferred steps of the method, a panel is fabricated on a substrate so that the panel can move between the first and second positions. An electrically conductive region is provided on panel.

The method further includes fabricating the coil on the substrate so that a magnetic flux in the coil is directed at the panel. To move the panel, the coil is energized by a current so as to create a time-varying magnetic flux in the coil that induces the electromotive force (emf) in the conductive region of the panel and the emf generates a magnetic flux in the panel. Lenz's law requires that the panel magnetic flux opposes the coil magnetic flux thereby creating a repulsive magnetic force that moves the panel from the first position to the second position.

The preferred method also includes applying a drag force on the panel when the panel moves. The method further includes holding the panel in the second position after the magnetic force moves the panel to the second position.

Other features, means, and steps of the invention are disclosed in the detailed description of the invention and the figures that form a part of the specification.

BRIEF DESCRIPTION OF THE DRAWINGS

FIGS. 2a, 2b, and 2c are cross-section views of the embodiment of FIG. 1 as viewed along line 2—2 and showing a sequence of movement of a panel that is moved by the actuator.

DETAILED DESCRIPTION OF THE PREFERRED EMBODIMENTS

Figure 1:
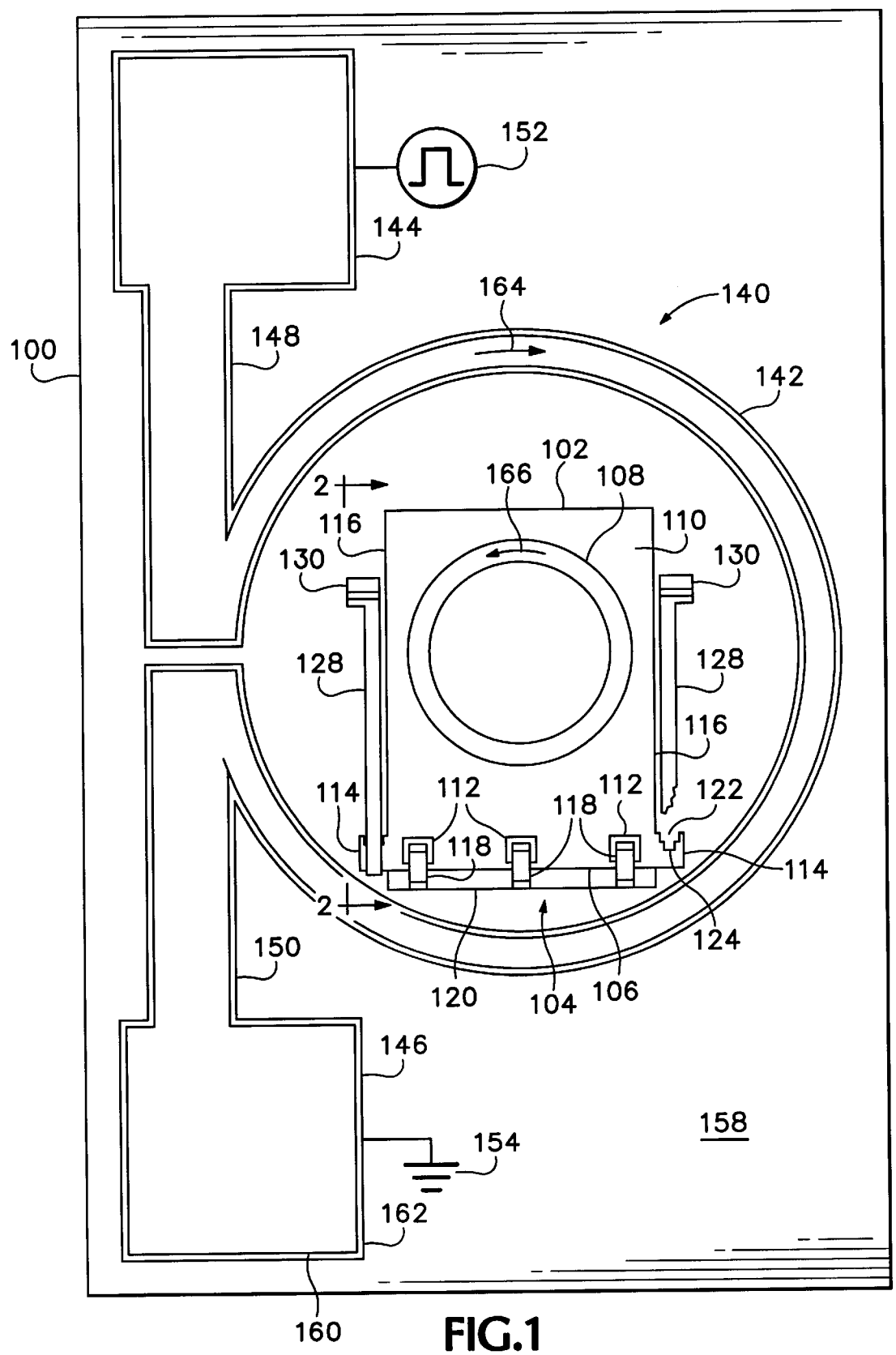
FIG. 1 is a top plan view of a preferred embodiment of a MEMS actuator of the present invention, wherein a portion of a flat spring arm is cut-away to reveal a detent receiver.

Microelectromechanical systems (MEMS) devices are usually formed as conformal layers applied onto a wafer, or substrate. An often used component of MEMS is a planar structure, that may include a mirror surface, lens or other MEMS device. Efficient fabrication of such planar structures requires that the planar structure be fabricated parallel to the substrate so that each layer used to form the structure can extend over the entire plane of the structure. However, many MEMS require planar structures that are oriented orthogonal to the substrate. Accordingly, such structures that are formed parallel to the substrate must be lifted up from their initial "as fabricated" orientation.

The present invention provides an apparatus and method of lifting such structures from the initial orientation to an oblique or orthogonal orientation. In addition, the present invention also provides an apparatus and method of moving nearly any type of MEMS structure from a first position to a second position.

The apparatus of the present invention comprises a time-varying magnetic field and a moveable MEMS structure having an electrically conductive portion that is located in the time-varying magnetic field.

The method of the present invention comprises locating a MEMS structure in a time-varying magnetic field so as to induce an electromotive force in the structure that creates an opposing magnetic field and creates a repulsive magnetic force that urges the MEMS structure to move. The apparatus and method are discussed in detail below.

Structure

With reference to the accompanying figures, a preferred embodiment of the apparatus of the present invention includes a substrate 100 on which a planar MEMS structure, exemplarily a panel 102 is located. The panel 102 is hingedly coupled to the substrate by a hinge 104 located along a lower panel margin 106.

The panel includes a conductive ring 108 affixed to a top side 1 10. Along the lower margin 106, the panel includes openings 112 that cooperate with the hinge 104, and tabs 114 that extend outward from lateral margins 116 of the panel.

Preferably, the panel is a single polysilicon layer and the conductive ring 108 is a metal layer formed on the polysilicon layer. The conductive ring is continuous, without any radial breaks through the ring along its circumference.

The hinge 104 includes three staples 118 that are fixed to an intermediary layer 120 that is fixed to the substrate 100. In elevation, as seen in FIGS. 2a–2c, the staples 118 are inverted U-shaped pieces that are fixed to the layer 120 and pass over the lower margin 106 of the panel and through the panel openings 112. Accordingly, the panel is constrained by the staple hinge to movement in rotation about the panel's lower margin 106. In alternative embodiments, the layer 120 is omitted and the staple hinge 104 is coupled directly to the top layer of the substrate 100.

The tabs 114 each include a detent receiver 122 that have a desired profile that defines a lowest receiver margin 124. A distance from the lowest receiver margin 124 to the panel lower margin 106 defines a moment arm 126.

The tabs 114 and detent receivers 122 work in cooperation with flat springs 128 that are located alongside the panel lateral margins 116. The flat springs have anchors 130 that are fixedly attached to the substrate 100. From the anchors, the flat springs are cantilevered over the substrate 100 high enough to pass over respective tabs 114 at their receivers 122. As shown in FIGS. 2a –2c, and described in greater detail below, the flat springs 128 and tabs 114 work together to support the panel in an upright orientation.

The flat springs 128 are cantilevered above the substrate from respective anchors 130 to the panel tabs 114, thus defining a cantilever length 132. The cantilever length 132 affects the forces that act on the panel during movement of the panel and while the panel is held in its upright orientation. The flat springs 128 provide a drag force on the panel during panel movement that attenuates undesirable reaction forces, such as a kickback, when the panel stops quickly.

The drag forces provided by the flat springs 128 must be selected so they do not impede the desired motion of the panel. As discussed below, many flat spring design parameters, such as size, cross-section area, cantilever length, and material may be selected to control system performance.

In alternative embodiments, the flat springs are tapered, or stepped down, in width along their length and the detent receivers 122 are likewise stepped down or tapered. The detent receivers 122 are shown stepped down in FIG. 1. Thus, as the panel 102 rotates upward, the flat spring 128 settles deeper into the detent receiver 122 to prevent the panel from bouncing backward, or to hold the panel at an intermediate position between laying flat and being fully upright.

A magnetic flux generator 140 is also located on the substrate 100. In the preferred embodiment, the flux generator is a single coil 142 of conductive material coupled to electrical pads 144 and 146 by conductive traces 148 and 150. The upper electrical pad 144 is coupled to a power source, schematically represented at 152 and the lower electrical pad 146 is coupled to a fixed potential, schematically represented as ground 154. Application of a current at pad 144, via the power source 152, creates a current in the coil 142.

In preferred embodiments, the substrate 100 includes a wafer 156 that is covered by an insulating layer 158 that electrically isolates the conductive components of the device. Thus, the coil 142 is electrically isolated from the panel 102. Also, when a voltage potential is created between the two pads 144, 146, the current is conducted along the traces and through the coil, rather than passing through the substrate.

In the present embodiment, the pads 144, 146, traces 148,150 and coil 142 are a metal layer 160 on top of a polysilicon layer 162 that is affixed to the substrate 100 on top of the insulating layer 158. Alternatively, the pads, traces, and coil may be a metal layer affixed directly to the substrate or the polysilicon layer 162 may be treated for high conductivity, wherein no metal layer may be necessary.

The pads 144 and 146 are suitable for the present embodiment to allow convenient means for connecting the power source 152 and ground 154 to the coil. However, in alternative embodiments, the traces 148 and 150 may be routed to other circuits (not shown) that are formed on the substrate. Further, arrays of panels 102 and flux generators 140 may populate a substrate, and traces 148, 150 from each flux generator may be appropriately coupled so that all, or selected groups, of flux generators are powered simultaneously.

Operation

As stated, an objective of the present invention is to move the panel from its orientation as fabricated, to some other desired orientation. In the exemplary embodiment shown, the panel is fabricated on top of, and parallel to, the substrate and it is desired to move the panel into an upright orientation so that the plane of the panel is substantially orthogonal to the plane of the substrate.

FIGS. 2a–2c show a sequence of the motion of the panel as it is moved from an orientation substantially parallel to the substrate in FIG. 2a to an upright orientation in FIG. 2c.

Accordingly, FIG. 2a shows the device of the present invention substantially as fabricated. The panel 102 is resting on the substrate 100. The flat springs 128 press lightly on the tabs 114, thus providing a small force to hold the panel down, against the substrate.

With reference to FIG. 1, the coil is energized by providing a time-varying voltage from the power source 152 to pad 144 while pad 146 is held at a lower potential, e.g., ground 154. Accordingly, a time-varying current flows in the direction 164 in the coil 142, establishing a time-varying electromotive force in the coil. An exemplary time-varying signal is a 5 volt, 2 to 3 milliamp step signal, or pulse.

The time-varying electromotive force in the coil 142 induces an electromotive force in the ring 108. Lenz's law states that the direction of the induced electromotive force in the ring is polarized in a direction that opposes the change that causes the induced electromotive force. Thus, the current direction 164 in coil 142 will induce a current flow in an opposite direction 166 in the ring.

The time-varying electromotive force in the coil 142 creates a time-varying magnetic flux through the coil. For current in the direction 164, the magnetic flux is oriented into the plane of the substrate 100. Likewise, for the induced current flowing in the ring in direction 166, a magnetic flux is created that is oriented out of the plane of the panel 102. Thus, electromotive forces in the coil and ring establish magnetic fluxes having opposite orientations.

The opposing magnetic fluxes cause a repulsive magnetic force, as is caused when two permanent magnets have their similar poles pushed together. Accordingly, the panel 102 is urged upward away from the substrate 100.

In FIG. 2b the panel 102 is shown moving upward, away from the substrate 100. The hinge 104 constrains the panel to pivoting motion about the panel's lower margin 106. In addition, the flat springs 128 apply a force against the panel tabs 114 that urge the panel downward, against the substrate. Thus, the magnetic force of the opposing magnetic fluxes of the ring and coil must overcome the force of the flat spring to move the panel upright.

As the panel 102 moves upward, away from the substrate 100, the flat spring deflects upward to accommodate the panel's movement as the largest dimension 168 of the tab rotates underneath the flat spring. Because the flat spring is pressing down against the tab while the panel moves upward, the flat spring provides a slight drag force on the panel during its motion.

The repulsive magnetic force pushes the panel 102 to its upright orientation, represented in FIG. 2c. At the upright orientation, the flat spring pushes downward against the lowest receiver margin 124 of the tab 114 and holds the panel upright. The flat springs hold the panel upright by pressing downward on the lowest receiver margin 124 while the flat panel margin 106 is against the layer 120 or the substrate surface.

The invention may include additional structure or stops (not shown) that prevent the panel from overshooting the desired orientation.

Alternative Embodiments

In the preferred embodiment described above, the panel 102 includes the conductive ring 108. In an alternative embodiment, the panel is conductive, or has a conductive sheet thereon, and includes no ring. In such an embodiment, the electromotive force in the coil 142 induces eddy currents in the panel that create opposing fields of magnetic flux that form the repulsive force to the magnetic flux generated by the electromotive force in the coil. Accordingly, as described above, the panel would move upright in response to a changing electromotive force in the coil.

In the preferred embodiment of FIGS. 1 and 2a–2c, the conductive ring 108 is substantially concentric with the coil 142. In alternative embodiments the ring 108, or other conductive portion of the panel 102 is not concentric with the coil. However, if the ring, or conductive portion, is not concentric, the repulsive magnetic force that acts on the panel may be less than the repulsive magnetic force that would act on a concentrically located conductive portion.

The panel 102 may be connected to another device on the MEMS, as by a connecting rod (not shown). A connecting rod may be formed on, and extend from, the lower margin 106, so as to rotate as the panel rotates. Accordingly, as the panel moves, the panel can do work on other MEMS devices. Similarly, a connecting rod may be hingedly coupled to the top surface 110 of the panel so as to push another device as the panel moves.

The MEMS planar structure may be something other than a panel. Indeed, the planar structure can be a simple ring that is coupled to a rod that is hingedly coupled to the substrate, or the ring may itself be directly, hingedly coupled to the substrate.

The panel 102 may be hinged in alternative ways. For example, the hinge may be outside the coil. Alternative hinge designs are also within the scope of the invention, including such hinges as flexible materials, channels, slots, and other designs that permit the panel to pivot relative to the substrate 100.

Alternatively, the panel need not be hinged. Instead, the objective may be to keep the panel substantially parallel to the substrate, but raise it above the substrate a desired distance. In such an embodiment, a scaffold (not shown) may be located proximate the panel to support the panel after the repulsive magnetic force has pushed the panel upward. Such a scaffold may include catches that grab the panel when the panel is moved to a desired location.

The coil 142 may be smaller or larger. In an embodiment having a smaller coil 142, the coil may be located beneath the panel 102. In an embodiment having a larger coil 142, plural panels 102 may be located within the perimeter of the coil 142 and the plural panels would be moved upright simultaneously.

Additionally, the coil 142 may be located on a separate substrate from the substrate 100 that supports the panel. Advanced MEMS may have multiple layer substrates and coils 142 may be formed on first substrates while panels 102, or other planar structures, are formed and supported on second substrates and subsequently sandwiched to the first substrate.

The panel may have an initial orientation that is oblique to the substrate and a final orientation that is likewise oblique to the substrate. The initial orientation may be an angle of 15 degrees to the substrate and the final orientation may be an angle of 45 degrees to the substrate. In such an embodiment, the flat spring may be replaced by a drag bar, or other device that holds the panel in a desired orientation.

The magnetic flux generated by the magnetic flux generator 140 is a vector, having direction and magnitude. In the preferred embodiments disclosed above, the direction is substantially orthogonal to the substrate 100 and to the panel 102, at the panel's initial, "as-fabricated," position. However, the flux may have other orientations.

The magnetic flux generator 140 may be mounted at an angle relative to the substrate 100. In such embodiments, the flux direction may be viewed as having orthogonal components along a Cartesian coordinate system. The coordinate system may be attached to the substrate or the panel, as desirable for analysis. Accordingly, the magnetic flux may be resolved into X and Y coordinates, where, for example, the X axis is orthogonal to the panel at the panel's initial position. Thus, the flux generator may be positioned as desired, so long as the flux can be resolved into a component that is substantially orthogonal to the panel.

The coil 142 of the magnetic flux generator may be two or more coils that are surface mounted to the MEMS substrate or formed on the MEMS substrate and separated by non-conducting layers.

This specification sets forth the best mode for carrying out the invention as known at the time of filing the Pat. No. application and provides sufficient information to enable a person skilled in the art to make and use the invention. The specification further describes materials, shapes, configurations and arrangements of parts for making a using the invention. However, it is intended that the scope of the invention shall be limited by the language of the claims and the law of the land as pertains to valid U.S. patents.

What is claimed is:

1. A microelectromechanical systems actuator, comprising:
   (a) a substrate;
   (b) a magnetic flux generator providing a magnetic flux along a flux direction; and
   (c) a substantially planar device coupled to the substrate, the planar device being moveable between a first position and a second position, the planar device further having an electrically conductive portion thereon, and wherein activation of the magnetic flux generator creates a time-varying, first magnetic flux along the flux direction that induces an electromotive force in the conductive portion of the planar device that creates a second magnetic flux in a direction that opposes the flux direction so as to create a repulsive magnetic force between the magnetic flux generator and the planar device that moves the planar device from the first position to the second position.

2. The microelectromechanical systems actuator of claim 1, wherein the magnetic flux generator is a coil coupled to a power source that provides a time-varying electrical current.

3. The microelectromechanical systems actuator of claim 1, wherein the magnetic flux generator is a coil formed on the substrate and coupled to a power source that provides a time-varying electrical current.

4. The microelectromechanical systems actuator of claim 1, wherein the conductive region of the planar device is a metallic ring.

5. The microelectromechanical systems actuator of claim 1, wherein the planar device is a polysilicon panel having a metallic ring coupled thereto.

6. The microelectromechanical systems actuator of claim 1, wherein the planar device includes a layer of conductive material.

7. The microelectromechanical systems actuator of claim 1, wherein the planar device is hingedly coupled to the substrate and the first position is a position in which the planar device is substantially parallel to the substrate and the second position is a position in which the planar device is not parallel to the substrate.

8. The microelectromechanical systems actuator of claim 1, further comprising a flat spring that holds the planar device in the second position.

9. The microelectromechanical systems actuator of claim 1, further comprising a flat spring that provides a drag force on the planar device as the planar device moves from the first position to the second position.

10. A microelectromechanical systems actuator, comprising:
    (a) a substantially planar substrate;
    (b) a panel hingedly coupled to the substrate for movement between a first position and a second position, the panel including an electrically conductive portion thereon;
    (c) an electrically conductive coil coupled to the substrate and substantially encircling the electrically conductive portion of the panel; and
    (d) a power source coupled to the coil for providing a time-varying electrical current in the coil that creates a first time-varying magnetic flux through an area substantially encompassed by the coil, and the first time-varying magnetic flux induces an electromotive force in the conductive portion of the panel that creates a second time-varying magnetic flux that opposes the first magnetic flux and moves the panel from the first position to the second position.

11. The microelectromechanical systems actuator of claim 10, wherein the electrically conductive portion is a metallic ring.

12. The microelectromechanical systems actuator of claim 10, wherein the electrically conductive portion is a conducive layer of the panel.

13. The microelectromechanical systems actuator of claim 10, further comprising a flat spring that holds the panel in the second position.

14. The microelectromechanical systems actuator of claim 10, further comprising a flat spring that provides a drag force on the panel as the panel moves between the first and second positions.

15. The microelectromechanical systems actuator of claim 10, further comprising a drag arm that provides a drag force on the panel as the panel moves between the first and second positions.

16. The microelectromechanical systems actuator of claim 15, wherein the drag arm holds the panel at any position between the first and second positions when the first and second time-varying magnetic fluxes are of a magnitude that does not create a force sufficient to move the panel from the first position to the second position.

17. The microelectromechanical systems actuator of claim 10, wherein a third time-varying magnetic flux in the coil induces an opposing fourth time-varying magnetic flux in the panel that creates a repulsive magnetic force that moves the panel to a third position.

18. The microelectromechanical systems actuator of claim 10, wherein the time-varying electrical current is a current pulse.

19. A method of moving a micromechanical device between a first position and a second position for use in a microelectromechanical system, comprising the steps:

(a) fabricating a micromechanical device having an electrically conductive region; and (b) generating a first magnetic flux proximate the micromechanical device so as to induce a first electromotive force in the conductive region of the micromechanical device that generates a second magnetic flux that opposes the first magnetic flux, and a first repulsive magnetic force of the opposing first and second magnetic fluxes moves the micromechanical device from the first position to the second position.

20. The method of claim 19, further comprising the steps of fabricating an electrically conductive coil on a substrate and locating the micromechanical device on the substrate, and providing a time-varying current in the coil thereby generating the first magnetic flux.

21. The method of claim 19, further comprising the steps of hingedly coupling the micromechanical device to a substrate and locating on the substrate an electrically conductive coil that generates the first magnetic flux.

22. The method of claim 19, further comprising the steps of fabricating a drag bar on a substrate that provides a drag force on the micromechanical device when the micromechanical device moves.

23. The method of claim 19, further including the steps of fabricating a member that supports the micromechanical device when the micromechanical device is in the second position.

24. The method of claim 19, further including the steps of fabricating a coil on a substrate and providing a first time-varying current to the coil to generate the first magnetic flux that causes the first repulsive magnetic force that moves the micromechanical device from the first position to the second position, and providing a second time-varying current to the coil to generate a third magnetic flux in the coil that induces a second electromotive force in the micromechanical device thereby creating a second repulsive magnetic force that moves the micromechanical device from the second position to a third position.

25. A method of moving a micromechanical panel between a first position and a second position in a microelectromechanical system, comprising the steps:

(a) fabricating a panel on a substrate so that the panel can move between a first position and a second position relative to the substrate, the panel including an electrically conductive region;

(b) fabricating a coil on the substrate so as to substantially encircle a portion of the electrically conductive region of the panel; and (c) energizing the coil with a first electrical current so as to create a first coil magnetic flux in the coil, the first coil magnetic flux inducing a first electromotive force in the conductive region of the panel and the first electromotive force generating a first panel magnetic flux that opposes the first coil magnetic flux thereby creating a first magnetic force that moves the panel from the first position to the second position.

26. The method of claim 25, further comprising fabricating a drag bar on the substrate that provides a drag force on the panel when the panel moves.

27. The method of claim 25, further including the steps of fabricating a drag bar on the substrate that holds the panel in the second position after the first magnetic force moves the panel to the second position.

28. The method of claim 25, further including the step of forming the electrically conductive region of the panel as a metallic ring.

29. The method of claim 25, further including the step of energizing the coil with a second electrical current so as to create a second coil magnetic flux that induces a second panel magnetic flux and creates a second magnetic force that moves the panel from the second position to a third position.

30. The method of claim 25, further comprising the steps of fabricating a hinge and hingedly coupling the panel to the substrate so that the panel can move pivotally relative to the substrate.

* * * * *

UNITED STATES PATENT AND TRADEMARK OFFICE
CERTIFICATE OF CORRECTION

PATENT NO. : 6,351,051 B1
DATED : February 26, 2002
INVENTOR(S) : Sinclair et al.

It is certified that error appears in the above-identified patent and that said Letters Patent is hereby corrected as shown below:

<u>Title page,</u>
Item [54], Title, change to -- MICROELECTROMECHANICAL SYSTEMS ACTUATOR USING A TIME-VARYING MAGNETIC FIELD --

Signed and Sealed this

Twenty-second Day of October, 2002

Attest:

Attesting Officer

JAMES E. ROGAN
*Director of the United States Patent and Trademark Office*